United States Patent
Li et al.

(10) Patent No.: US 10,954,119 B2
(45) Date of Patent: Mar. 23, 2021

(54) MEMS MICROMIRROR AND MEMS OPTICAL SWITCH

(71) Applicant: INSTITUTE OF GEOLOGY AND GEOPHYSICS CHINESE ACADEMY OF SCIENCES (IGGCAS), Beijing (CN)

(72) Inventors: Hang Li, Beijing (CN); Chen Sun, Beijing (CN); Lianzhong Yu, Beijing (CN)

(73) Assignee: INSTITUTE OF GEOLOGY AND GEOPHYSICS CHINESE ACADEMY OF SCIENCES (IGGCAS), Beijing (CN)

( * ) Notice: Subject to any disclaimer, the term of this patent is extended or adjusted under 35 U.S.C. 154(b) by 0 days.

(21) Appl. No.: 16/997,093

(22) Filed: Aug. 19, 2020

(65) Prior Publication Data
US 2021/0053818 A1 Feb. 25, 2021

(30) Foreign Application Priority Data
Aug. 21, 2019 (CN) .......................... 201910771820.3

(51) Int. Cl.
*B81B 3/00* (2006.01)
*G02B 26/08* (2006.01)

(52) U.S. Cl.
CPC ........ *B81B 3/0035* (2013.01); *G02B 26/0833* (2013.01); *B81B 2201/045* (2013.01)

(58) Field of Classification Search
CPC ................ B81B 3/0035; B81B 3/0037; B81B 2201/045; G02B 26/0833; G02B 26/0841
See application file for complete search history.

(56) References Cited

U.S. PATENT DOCUMENTS

| 6,925,710 B1 * | 8/2005 | Scalf ................... B81C 1/00126 29/830 |
| 2004/0060898 A1 * | 4/2004 | Tsai ................... G02B 26/0833 216/2 |
| 2007/0041080 A1 | 2/2007 | Mizuno et al. |

FOREIGN PATENT DOCUMENTS

| CN | 101515065 A | 8/2009 |
| JP | 2004082288 A | 3/2004 |
| KR | 101445028 B1 | 9/2014 |

OTHER PUBLICATIONS

First Office Action in counterpart Chinese Application No. 201910771820.3, dated Feb. 26, 2020.

* cited by examiner

*Primary Examiner* — Cara E Rakowski
(74) *Attorney, Agent, or Firm* — Westbridge IP LLC

(57) ABSTRACT

A MEMS micromirror includes a mirror surface driving structure which is positioned on a substrate and includes two L-shaped structures in head-to-tail arrangement. Each L-shaped structure includes a second torsion beam, an L-shaped transverse plate and a second comb-shaped structure. The first driving electrode is provided on the substrate at a position under a head end of the L-shaped transverse plate, the head end of the L-shaped transverse plate is rotatable with support of the second torsion beam, and a tail end of the L-shaped transverse plate is connected with the second comb-shaped structure. The micromirror surface layer is disposed above the mirror surface driving structure, the first torsion beam is fixed by the substrate and supports two sides of the micromirror surface layer, and two sides, corresponding to the second comb-shaped structures, of the micromirror surface layer are provided with first comb-shaped structures, respectively.

8 Claims, 2 Drawing Sheets

MEMS MICROMIRROR AND MEMS OPTICAL SWITCH

CROSS-REFERENCE TO RELATED APPLICATIONS

The application claims priority to Chinese patent application No. 201910771820.3, filed on Aug. 21, 2019, the entire contents of which are incorporated herein by reference.

TECHNICAL FIELD

The present disclosure relates to the technical field of micro-electro-mechanical systems, in particular to a MEMS micromirror and a MEMS optical switch.

BACKGROUND

A Micro-Electro-Mechanical System (MEMS) is an independent intelligent system having micro- or nano-scale inner structures and mainly composed of a sensor, an actuator and a micro-energy source. The micro-electro-mechanical system involves various disciplines and engineering technologies such as physics, semiconductors, optics, electronic engineering, chemistry, material engineering, mechanical engineering, medicine, information engineering and bioengineering, and opens up a wide range of applications in the fields such as intelligent systems, consumer electronics, wearable devices, intelligent home, and synthetic biology and microfluidics in systems biotechnology.

The commonly used MEMS micromirror is one of MEMS products. At present, most MEMS micromirrors adopt thermal driving, electromagnetic driving or electrostatic driving, among which the electrostatic driving usually uses comb or plate electrodes.

However, in electrostatic driving, the motion space between electrodes is large, and as the motion space increases, the driving voltage also increases, resulting in increase in power consumption of the device.

Therefore, how to reduce the driving voltage and increase the torsion angle of the MEMS micromirrors is an urgent technical problem to be solved.

SUMMARY

In view of the above problems, the present disclosure provides a MEMS micromirror and a MEMS optical switch that overcome or at least partially solve the above problems.

In one aspect, an embodiment of the present disclosure provides a MEMS micromirror, including: a substrate, two first driving electrodes, a mirror surface driving structure, a micromirror surface layer and a first torsion beam. Wherein the mirror surface driving structure is positioned on the substrate and comprises two L-shaped structures in head-to-tail arrangement, and each L-shaped structure comprises a second torsion beam, an L-shaped transverse plate and a second comb-shaped structure, wherein the second torsion beam is fixedly arranged on the substrate, the first driving electrode is provided on the substrate at a position corresponding to a head end of the L-shaped transverse plate, the head end of the L-shaped transverse plate is rotatable with support of the second torsion beam, and a tail end of the L-shaped transverse plate is connected with the second comb-shaped structure; the micromirror surface layer is disposed above the mirror surface driving structure, the first torsion beam is fixed to the substrate and supports two sides of the micromirror surface layer, and two sides, corresponding to the second comb-shaped structures, of the micromirror surface layer are provided with first comb-shaped structures, respectively; and when a driving voltage is applied to one first driving electrode, the first driving electrode produces a downward driving force to the head end of the corresponding L-shaped transverse plate to apply a torque to the second torsion beam, and the second comb-shaped structure is inserted into the corresponding first comb-shaped structure while rotating with the second torsion beam such that an overlapping area between the second comb-shaped structure and the first comb-shaped structure is changed, and a downward electrostatic attraction force to the first comb-shaped structure is produced, thereby driving the micromirror surface layer to rotate.

Further, a first detection electrode is also provided on the substrate at a position corresponding to the head end of each L-shaped transverse plate, and the first detection electrode is used for judging whether a first rotation angle of the L-shaped transverse plate meets a first preset rotation angle or not after the driving voltage is applied to the corresponding first driving electrode, and if not, controlling the driving voltage of the first driving electrode to be increased or decreased.

Further, a second driving electrode and a second detection electrode are provided on the substrate at a position corresponding to each second comb-shaped structure; the second driving electrode is used for producing a downward driving force to the second comb-shaped structure, and when the second comb-shaped structure is forced to rotate downwards, the corresponding first comb-shaped structure rotates along with the downward rotation of the second comb-shaped structure; and the second detection electrode is used for judging whether a second rotation angle of the L-shaped transverse plate meets a second preset rotation angle or not after a driving voltage is applied to the second driving electrode, and if not, controlling the driving voltage of the second driving electrode to be increased or decreased.

Further, the first torsion beam is hinged to the micromirror surface layer, and the second torsion beams are hinged to the L-shaped transverse plates.

Further, the micromirror surface layer is provided with a mirror surface which rotates along with rotation of the micromirror surface layer.

In another aspect, an embodiment of the present disclosure further provides a MEMS optical switch, including: a substrate, and N MEMS micromirrors arranged as a matrix on the substrate; wherein each MEMS micromirror comprises: two first driving electrodes 101, a mirror surface driving structure, a micromirror surface layer and a first torsion beam; wherein the mirror surface driving structure is positioned on the substrate and comprises two L-shaped structures in head-to-tail arrangement, and each L-shaped structure comprises a second torsion beam, an L-shaped transverse plate and a second comb-shaped structure, wherein the second torsion beam is fixedly arranged on the substrate, the first driving electrode is provided on the substrate at a position corresponding to a head end of the L-shaped transverse plate, the head end of the L-shaped transverse plate is rotatable with support of the second torsion beam, and a tail end of the L-shaped transverse plate is connected with the second comb-shaped structure;

the micromirror surface layer is disposed above the mirror surface driving structure, the first torsion beam is fixed to the substrate and supports two sides of the micromirror surface layer, and two sides, corresponding to the second comb-shaped structures, of the micromirror surface layer are provided with first comb-shaped structures, respectively; and when a driving voltage is applied to one first driving electrode, the first driving electrode produces a downward driving force to the head end of the corresponding L-shaped transverse plate to apply a torque to the second torsion beam, and the second comb-shaped structure is inserted into the corresponding first comb-shaped structure while rotating with the second torsion beam such that an overlapping area between the second comb-shaped structure and the first comb-shaped structure is changed, and a downward electrostatic attraction force to the first comb-shaped structure is produced, thereby driving the micromirror surface layer to rotate.

Further, a first detection electrode is also provided on the substrate at a position corresponding to the head end of each L-shaped transverse plate, and the first detection electrode is used for judging whether a first rotation angle of the L-shaped transverse plate meets a first preset rotation angle or not after the driving voltage is applied to the corresponding first driving electrode, and if not, controlling the driving voltage of the first driving electrode to be increased or decreased.

Further, a second driving electrode and a second detection electrode are provided on the substrate at a position corresponding to each second comb-shaped structure;

the second driving electrode is used for producing a downward driving force to the second comb-shaped structure, and when the second comb-shaped structure is forced to rotate downwards, the corresponding first comb-shaped structure rotates along with the downward rotation of the second comb-shaped structure; and the second detection electrode is used for judging whether a second rotation angle of the L-shaped transverse plate meets a second preset rotation angle or not after a driving voltage is applied to the second driving electrode, and if not, controlling the driving voltage of the second driving electrode to be increased or decreased.

Further, the first torsion beam is hinged to the micromirror surface layer, and the second torsion beams are hinged to the L-shaped transverse plates.

Further, the micromirror surface layer is provided with a mirror surface which rotates along with rotation of the micromirror surface layer.

According to one or more technical solutions in the embodiments of the present disclosure, at least the following technical effects or advantages are provided.

In the MEMS micromirror provided by the present disclosure, the mirror surface driving structure is positioned on the substrate and includes two L-shaped structures in head-to-tail arrangement, and each L-shaped structure includes a second torsion beam, an L-shaped transverse plate and a second comb-shaped structure, wherein a head end of the L-shaped transverse plate is rotatable with support of the second torsion beam, and a tail end of the L-shaped transverse plate is connected with the second comb-shaped structure; the micromirror surface layer is disposed above the mirror surface driving structure, two sides of the micromirror surface layer is supported by the first torsion beam on the substrate while the other two sides of the micromirror surface layer are provided with first comb-shaped structures; and when a driving voltage is applied to one first driving electrode which is provided on the substrate at a position facing the head end of the corresponding L-shaped transverse plate, the first driving electrode produces a downward driving force to the head end of the L-shaped transverse plate to drive the head end of the L-shaped transverse plate to rotate about the second torsion beam, and the second comb-shaped structure is inserted into the corresponding first comb-shaped structure such that an overlapping area between the second comb-shaped structure and the first comb-shaped structure is changed, and a downward electrostatic attraction force to the first comb-shaped structure is produced, thereby driving the micromirror surface layer to rotate. As the mirror surface driving structure adopts the head-to-tail arrangement of the two L-shaped structures in which the position of the second torsion beam of each L-shaped structure is biased, i.e., equivalent to the lever principle, when a small driving voltage is applied to the corresponding first driving electrode under the head end of the L-shaped transverse plate, the second comb-shaped structure at the tail end of the L-shaped transverse plate may make a large displacement. Meanwhile, the overlapping area between the first comb-shaped structure and the second comb-shaped structure is greatly changed, so that the second comb-shaped structure produces a large electrostatic attraction force to the first comb-shaped structure, and the micromirror surface layer to which the first comb-shaped structure belongs is driven to rotate.

BRIEF DESCRIPTION OF DRAWINGS

Other advantages and benefits will become apparent to those of ordinary skill in the art upon reading the following detailed description of the preferred embodiments. The drawings are only for the purpose of illustrating preferred embodiments and are not to be construed as limiting the disclosure. Moreover, the same reference numerals are used throughout the drawings to refer to the same parts. In the drawings.

DETAILED DESCRIPTION OF THE EMBODIMENTS

Figure 1:
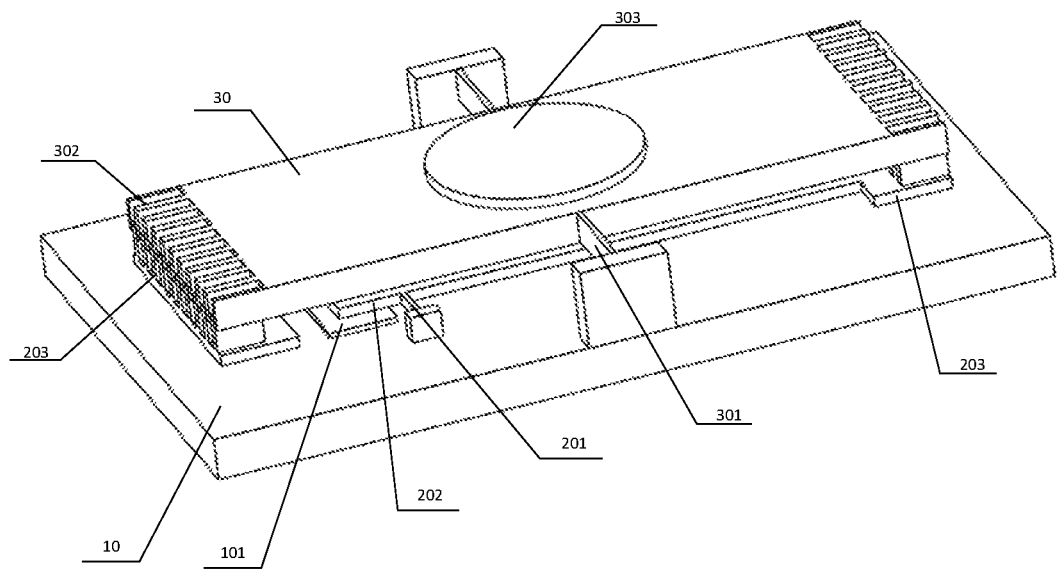
FIG. 1 shows a schematic structural diagram of a MEMS micromirror in an embodiment of the present disclosure.

Exemplary embodiments of the present disclosure will be described in more detail below with reference to the accompanying drawings. While exemplary embodiments of the present disclosure are shown in the drawings, it is to be understood that the present disclosure may be implemented in various forms and should not be limited to the embodiments set forth herein. Rather, these embodiments are provided so that this disclosure will be thorough and complete, and will fully convey the scope of the disclosure to those skilled in the art.

Embodiment 1

Figure 2:
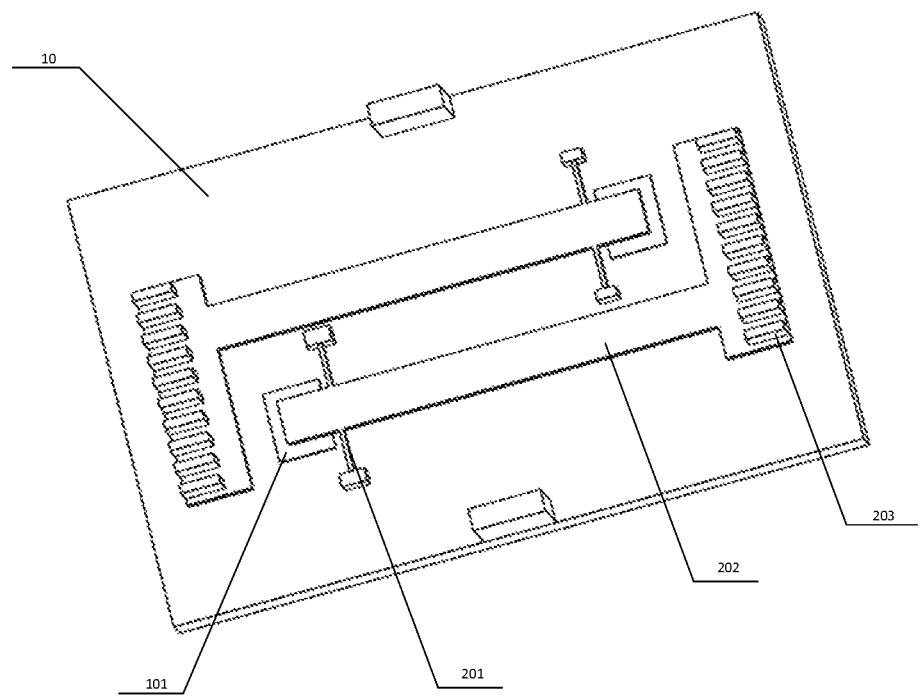
FIG. 2 show a schematic structural diagram of a mirror surface driving structure in an MEMS micromirror in an embodiment of the present disclosure.

The Embodiment 1 of the disclosure provides a MEMS micromirror, as shown in FIGS. 1 and 2, including: a substrate 10, two first driving electrodes 101, a mirror surface driving structure, a micromirror surface layer 30 and a first torsion beam 301.

The mirror surface driving structure is positioned on the substrate 10 and includes two L-shaped structures in a head-to-tail arrangement, and each L-shaped structure includes a second torsion beam 201, an L-shaped transverse plate 202 and a second comb-shaped structure 203. The second torsion beam 201 is fixedly arranged on the substrate 10, the first driving electrode is provided on the substrate 10 at a position corresponding to a head end of the L-shaped transverse plate 202, the head end of the L-shaped transverse plate 202 is rotatable with support of the second torsion beam 201, and a tail end of the L-shaped transverse plate 202 is connected with the second comb-shaped structure 203. The second torsion beam 201 of the L-shaped structure is biased on the L-shaped transverse plate 202, specifically, the second torsion beam 201 is close to the head end of the L-shaped transverse plate 202, so that the respective arms of force from two ends of the L-shaped transverse plate 202 to the second torsion beam 201 are different, and thus a lever effect can be generated by which a small force applied to the end with the short arm of force, i.e., a small force produced by application of a small driving voltage, will causes a large displacement of the end with the long arm of force.

The micromirror surface layer 30 is disposed above the mirror surface driving structure, the first torsion beam 301 is fixed to the substrate and supports two sides of the micromirror surface layer 30, and two sides, corresponding to the second comb-shaped structures 203, of the micromirror surface layer 30 are provided with first comb-shaped structures, respectively.

When a driving voltage is applied to one first driving electrode, the first driving electrode produces a downward driving force to the head end of the corresponding L-shaped transverse plate 202 to apply a torque to the second torsion beam 201, and the second comb-shaped structure 203 is inserted into the corresponding first comb-shaped structure 302 while rotating with the second torsion beam such that an overlapping area between the second comb-shaped structure 203 and the first comb-shaped structure 302 is changed, and a downward electrostatic attraction force to the first comb-shaped structure 302 is produced, thereby driving the micromirror surface layer 30 to rotate. After the end with the long arm of force makes a large displacement, the distance between the second comb-shaped structure 203 of the end with the long arm of force and the first comb-shaped structure 302 of the micromirror surface layer 30 is gradually reduced, that is, the gap is also gradually reduced, so that the electrostatic attraction force between the second comb-shaped structure 203 and the first comb-shaped structure 302 drives the micromirror surface layer 30 to rotate downwards.

In embodiments of the disclosure, the two ends of the L-shaped transverse plate 202 are equivalent to two ends of a lever, and in order to keep the moment balance, the head end (the end at the first driving electrode) of the L-shaped transverse plate 202 corresponds to a large force and a small arm of force, while the other end corresponds to a small force and a large arm of force.

The function of the L-shaped transverse plate is as follows: a large driving force can be produced by applying a small driving voltage at the head end of the L-shaped transverse plate 202 (due to the small gap), and causes a large displacement of the trail end of the L-shaped transverse plate 202.

In conventional methods, in order to ensure that the micromirror surface has a large torsion angle, a gap between the plate electrodes is increased to ensure that the micromirror surface has sufficient motion space, which greatly increases the required driving voltage.

As the driving voltage is applied to the first driving electrode, the head end of the L-shaped transverse plate 202 is driven by the driving force of the first driving electrode to move the tail end of the L-shaped transverse plate 202 upwards along with the rotation of the second torsion beam 201 such that the overlapping area of the first comb-shaped structure 302 and the second comb-shaped structure 203 is changed, and the electrostatic attraction force is generated between the first comb-shaped structure 302 and the second comb-shaped structure 203. The electrostatic attraction force is applied to the first comb-shaped structure 302, and has a direction perpendicular to the micromirror surface layer 30 to which the first comb-shaped structure 302 belongs, so that the micromirror surface layer 30 is rotated about the first torsion beam 301. The micromirror surface layer 30 is provided with a mirror surface 303 which rotates along with rotation of the micromirror surface layer 30.

When no driving voltage is applied to the first driving electrode, the second comb-shaped structure 203 of the L-shaped structure moves downwards obliquely due to gravity, and the head end of the L-shaped structure moves upwards.

After the driving voltage is applied to the first driving electrode, the head end of the L-shaped structure receives a downward acting force, so that the second comb-shaped structure 203 moves upwards.

A first detection electrode is also provided on the substrate 10 at a position corresponding to the head end of each L-shaped transverse plate 202, and the first detection electrode is used for judging whether a first rotation angle of the L-shaped transverse plate 202 meets a first preset rotation angle or not after the driving voltage is applied to the corresponding first driving electrode, and if not, controlling the driving voltage of the first driving electrode to be increased or decreased.

In a preferred embodiment, a second driving electrode and a second detection electrode are provided on the substrate 10 at a position corresponding to each second comb-shaped structure 203.

The second driving electrode is used for producing a downward driving force to the second comb-shaped structure 203, and when the second comb-shaped structure is forced to rotate downwards, the corresponding first comb-shaped structure 302 rotates along with the downward rotation of the second comb-shaped structure 203.

The second detection electrode is used for judging whether a second rotation angle of the L-shaped transverse plate 202 meets a second preset rotation angle or not after a driving voltage is applied to the second driving electrode, and if not, controlling the driving voltage of the second driving electrode to be increased or decreased.

Therefore, in embodiments of the present disclosure, not only the head end of the L-shaped transverse plate 202 can be applied with a driving force, but also the second comb-shaped structure 203 at the tail end of the L-shaped transverse plate 202 can be applied with a driving force. The rotation of the L-shaped structure is controlled in both directions by applying driving forces to both ends of the L-shaped transverse plate 202.

During application of driving forces, the driving voltages are detected and adjusted via the first detection electrode and the second detection electrode, respectively, so that the rotation angle of the L-shaped transverse plate 202 is controlled, and finally the rotation angle of the micromirror surface layer 30 is accurately controlled.

The first torsion beam 301 is hinged to the micromirror surface layer 30, and the second torsion beams 201 are hinged to the L-shaped transverse plates 202. As such, the rotation of the L-shaped transverse plates and the rotation of the micromirror surface layer are both achieved.

The micromirror surface layer 30 is provided with a mirror surface which rotates along with rotation of the micromirror surface layer 30.

The MEMS micromirror is applicable to image scanning.

Embodiment 2

Figure 3:
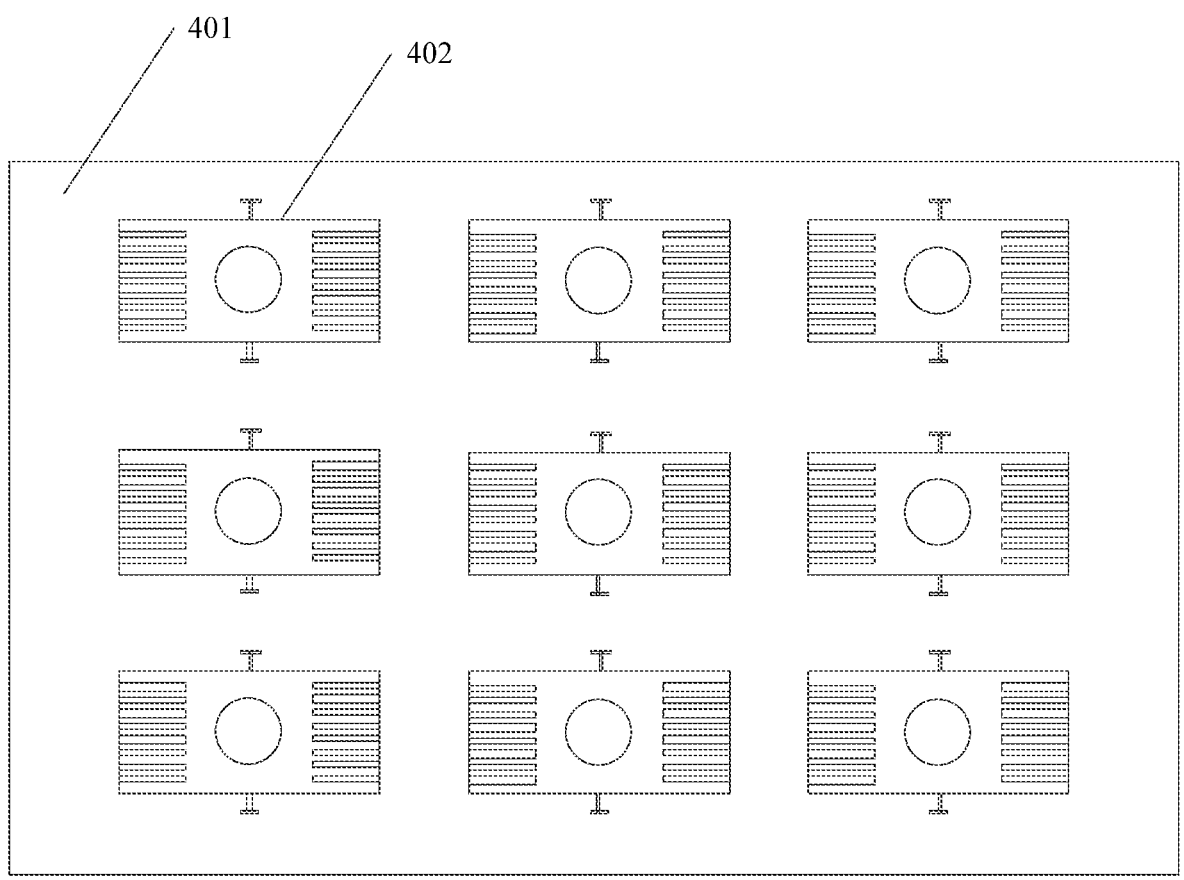
FIG. 3 shows a schematic structural diagram of a MEMS optical switch in an embodiment of the disclosure.

Based on the same inventive concept, this embodiment of the disclosure provides a MEMS optical switch, as shown in FIG. 3, including: a substrate 401, and N MEMS micromirrors 402 arranged as a matrix on the substrate 401.

Each MEMS micromirror 402 includes: two first driving electrodes 101, a mirror surface driving structure, a micromirror surface layer and a first torsion beam.

The mirror surface driving structure is positioned on the substrate and comprises two L-shaped structures in head-to-tail arrangement, and each L-shaped structure includes a second torsion beam, an L-shaped transverse plate and a second comb-shaped structure. The second torsion beam is fixedly arranged on the substrate, the first driving electrode is provided on the substrate at a position corresponding to a head end of the L-shaped transverse plate, the head end of the L-shaped transverse plate is rotatable with support of the second torsion beam, and a tail end of the L-shaped transverse plate is connected with the second comb-shaped structure.

The micromirror surface layer is disposed above the mirror surface driving structure, the first torsion beam is fixed to the substrate and supports two sides of the micromirror surface layer, and two sides, corresponding to the second comb-shaped structures, of the micromirror surface layer are provided with first comb-shaped structures, respectively.

When a driving voltage is applied to one first driving electrode, the first driving electrode produces a downward driving force to the head end of the corresponding L-shaped transverse plate to apply a torque to the second torsion beam, and the second comb-shaped structure is inserted into the corresponding first comb-shaped structure while rotating with the second torsion beam such that an overlapping area between the second comb-shaped structure and the first comb-shaped structure is changed, and a downward electrostatic attraction force to the first comb-shaped structure is produced, thereby driving the micromirror surface layer to rotate.

Further, when no driving voltage is applied to the first driving electrode, the second comb-shaped structure 203 of the L-shaped structure moves downwards obliquely due to gravity, and the head end of the L-shaped structure moves upwards.

After the driving voltage is applied to the first driving electrode, the head end of the L-shaped structure receives a downward force, so that the second comb-shaped structure moves upwards.

Further, a first detection electrode is also provided on the substrate at a position corresponding to the head end of each L-shaped transverse plate, and the first detection electrode is used for judging whether a first rotation angle of the L-shaped transverse plate meets a first preset rotation angle or not after the driving voltage is applied to the corresponding first driving electrode, and if not, controlling the driving voltage of the first driving electrode to be increased or decreased.

Further, a second driving electrode and a second detection electrode are provided on the substrate at a position corresponding to each second comb-shaped structure. The second driving electrode is used for producing a downward driving force to the second comb-shaped structure, and when the second comb-shaped structure is forced to rotate downwards, the corresponding first comb-shaped structure rotates along with the downward rotation of the second comb-shaped structure. The second detection electrode is used for judging whether a second rotation angle of the L-shaped transverse plate meets a second preset rotation angle or not after a driving voltage is applied to the second driving electrode, and if not, controlling the driving voltage of the second driving electrode to be increased or decreased.

Further, the first torsion beam is hinged to the micromirror surface layer, and the second torsion beams are hinged to the L-shaped transverse plates.

Further, the micromirror surface layer is provided with a mirror surface which rotates along with rotation of the micromirror surface layer.

The MEMS optical switch is applicable to optical devices for optical fiber communication.

Although preferred embodiments of the present disclosure have been described, additional variations and modifications of these embodiments will occur to those skilled in the art upon attaining the basic inventive concept. It is therefore intended that the appended claims be interpreted as including the preferred embodiments and all such alterations and modifications as fall within the true scope of the present disclosure.

It will be apparent to those skilled in the art that various modifications and variations can be made in the present disclosure without departing from the spirit or scope of the disclosure. Thus, it is intended that the present disclosure cover the modifications and variations of this disclosure provided they come within the scope of the appended claims and their equivalents.

What is claimed is:

1. A Micro-Electro-Mechanical System (MEMS) micromirror, comprising: a substrate, two first driving electrodes, a mirror surface driving structure, a micromirror surface layer and a first torsion beam; wherein the mirror surface driving structure is positioned on the substrate and comprises two L-shaped structures in head-to-tail arrangement, and each L-shaped structure comprises a second torsion beam, an L-shaped transverse plate and a second comb-shaped structure, wherein the second torsion beam is fixedly arranged on the substrate, the first driving electrode is provided on the substrate at a position corresponding to a head end of the L-shaped transverse plate, the head end of the L-shaped transverse plate is rotatable with support of the second torsion beam, and a tail end of the L-shaped transverse plate is connected with the second comb-shaped structure;

the micromirror surface layer is disposed above the mirror surface driving structure, the first torsion beam is fixed to the substrate and supports two sides of the micromirror surface layer, and two sides, corresponding to the second comb-shaped structures, of the micromirror surface layer are provided with first comb-shaped structures, respectively; and when a driving voltage is applied to one first driving electrode, the first driving electrode produces a downward driving force to the head end of the corresponding L-shaped transverse plate to apply a torque to the second torsion beam, and the second comb-shaped structure is inserted into the corresponding first comb-shaped structure while rotating with the second torsion beam such that an overlapping area between the second comb-shaped structure and the first comb-shaped structure is changed, and a downward electrostatic attraction force to the first comb-shaped structure is produced, thereby driving the micromirror surface layer to rotate.

2. The MEMS micromirror of claim 1, further comprising a second driving electrode provided on the substrate at a position corresponding to each second comb-shaped structure; wherein
the second driving electrode is used for producing a downward driving force to the second comb-shaped structure, and when the second comb-shaped structure is forced to rotate downwards, the corresponding first comb-shaped structure rotates along with the downward rotation of the second comb-shaped structure.

3. The MEMS micromirror of claim 1, wherein the first torsion beam is hinged to the micromirror surface layer, and the second torsion beams are hinged to the L-shaped transverse plates.

4. The MEMS micromirror of claim 1, wherein the micromirror surface layer is provided with a mirror surface which rotates along with rotation of the micromirror surface layer.

5. A Micro-Electro-Mechanical System (MEMS) optical switch, comprising: a substrate, and N MEMS micromirrors arranged as a matrix on the substrate; wherein
each MEMS micromirror comprises: two first driving electrodes, a mirror surface driving structure, a micromirror surface layer and a first torsion beam; wherein
the mirror surface driving structure is positioned on the substrate and comprises two L-shaped structures in head-to-tail arrangement, and each L-shaped structure comprises a second torsion beam, an L-shaped transverse plate and a second comb-shaped structure, wherein the second torsion beam is fixedly arranged on the substrate, the first driving electrode is provided on the substrate at a position corresponding to a head end of the L-shaped transverse plate, the head end of the L-shaped transverse plate is rotatable with support of the second torsion beam, and a tail end of the L-shaped transverse plate is connected with the second comb-shaped structure;
the micromirror surface layer is disposed above the mirror surface driving structure, the first torsion beam is fixed to the substrate and supports two sides of the micromirror surface layer, and two sides, corresponding to the second comb-shaped structures, of the micromirror surface layer are provided with first comb-shaped structures, respectively; and
when a driving voltage is applied to one first driving electrode, the first driving electrode produces a downward driving force to the head end of the corresponding L-shaped transverse plate to apply a torque to the second torsion beam, and the second comb-shaped structure is inserted into the corresponding first comb-shaped structure while rotating with the second torsion beam such that an overlapping area between the second comb-shaped structure and the first comb-shaped structure is changed, and a downward electrostatic attraction force to the first comb-shaped structure is produced, thereby driving the micromirror surface layer to rotate.

6. The MEMS optical switch of claim 5, further comprising a second driving electrode provided on the substrate at a position corresponding to each second comb-shaped structure; wherein
the second driving electrode is used for producing a downward driving force to the second comb-shaped structure, and when the second comb-shaped structure is forced to rotate downwards, the corresponding first comb-shaped structure rotates along with the downward rotation of the second comb-shaped structure.

7. The MEMS optical switch of claim 5, wherein the first torsion beam is hinged to the micromirror surface layer, and the second torsion beams are hinged to the L-shaped transverse plates.

8. The MEMS optical switch of claim 5, wherein the micromirror surface layer is provided with a mirror surface which rotates along with rotation of the micromirror surface layer.

* * * * *